United States Patent
Tirén et al.

(10) Patent No.: US 10,475,616 B2
(45) Date of Patent: Nov. 12, 2019

(54) METHOD FOR MANUFACTURING NANOSTRUCTURES FOR A FIELD EMISSION CATHODE

(71) Applicant: Lightlab Sweden AB, Uppsala (SE)

(72) Inventors: Jonas Tirén, Uppsala (SE); Jan-Otto Carlsson, Uppsala (SE); Olesya Nikonova, Uppsala (SE)

(73) Assignee: Lightlab Sweden AB, Uppsala (SE)

( * ) Notice: Subject to any disclaimer, the term of this patent is extended or adjusted under 35 U.S.C. 154(b) by 53 days.

(21) Appl. No.: 15/571,293

(22) PCT Filed: May 16, 2016

(86) PCT No.: PCT/EP2016/060943
§ 371 (c)(1),
(2) Date: Nov. 2, 2017

(87) PCT Pub. No.: WO2016/184828
PCT Pub. Date: Nov. 24, 2016

(65) Prior Publication Data
US 2018/0114666 A1    Apr. 26, 2018

(30) Foreign Application Priority Data
May 18, 2015 (EP) ..................... 15167996

(51) Int. Cl.
*H01J 1/62* (2006.01)
*H01J 1/304* (2006.01)
(Continued)

(52) U.S. Cl.
CPC .............. *H01J 1/304* (2013.01); *B82Y 40/00* (2013.01); *C30B 7/105* (2013.01); *C30B 7/14* (2013.01);
(Continued)

(58) Field of Classification Search
None
See application file for complete search history.

(56) References Cited

U.S. PATENT DOCUMENTS

| | | | |
|---|---|---|---|
| 7,193,357 B2 | 3/2007 | Choi et al. | |
| 7,728,505 B2 | 6/2010 | Liu et al. | |

(Continued)

FOREIGN PATENT DOCUMENTS

| | | |
|---|---|---|
| EP | 1709665 A1 | 10/2006 |
| EP | 2784800 A1 | 10/2014 |

(Continued)

OTHER PUBLICATIONS

European Search Report for Application No. 15167996.6 dated Mar. 15, 2016, 12 pages.

(Continued)

*Primary Examiner* — Vip Patel
(74) *Attorney, Agent, or Firm* — RMCK Law Group, PLC

(57) ABSTRACT

The present invention relates to the field of field emission lighting, and specifically to a method for forming a field emission cathode. The method comprises arranging a growth substrate in a growth solution comprising a Zn-based growth agent, the growth solution having a pre-defined pH-value at room temperature; increasing the pH value of the growth solution to reach a nucleation phase; upon increasing the pH of the solution nucleation starts. The growth phase is then entered by decreasing the pH. The length of the nanorods is determined by the growth time. The process is terminated by increasing the pH to form sharp tips. The invention also relates to a structure for such a field emission cathode and to a lighting arrangement comprising the field emission cathode.

17 Claims, 5 Drawing Sheets

(51) Int. Cl.
*H01J 9/02* (2006.01)
*H01J 63/02* (2006.01)
*H01J 63/06* (2006.01)
*C30B 7/14* (2006.01)
*C30B 29/16* (2006.01)
*B82Y 40/00* (2011.01)
*C30B 7/10* (2006.01)

(52) U.S. Cl.
CPC ............ *C30B 29/16* (2013.01); *H01J 1/3044* (2013.01); *H01J 9/025* (2013.01); *H01J 63/02* (2013.01); *H01J 63/06* (2013.01); *C30B 7/10* (2013.01); *H01J 2201/3043* (2013.01); *H01J 2201/30496* (2013.01)

(56) References Cited

U.S. PATENT DOCUMENTS

| | | |
|---|---|---|
| 2004/0061429 A1 | 4/2004 | Sakai et al. |
| 2006/0091782 A1 | 5/2006 | Liu et al. |
| 2007/0284573 A1 | 12/2007 | Tseng et al. |
| 2009/0011224 A1 | 1/2009 | Nagarajan et al. |
| 2014/0346976 A1 | 11/2014 | Hu et al. |

FOREIGN PATENT DOCUMENTS

| | | |
|---|---|---|
| EP | 3035368 A1 | 6/2016 |
| WO | 2005074006 A1 | 8/2005 |

OTHER PUBLICATIONS

International Search Report and Written Opinion for International Application No. PCT/EP2016/060943 dated Oct. 4, 2016, 19 pages.

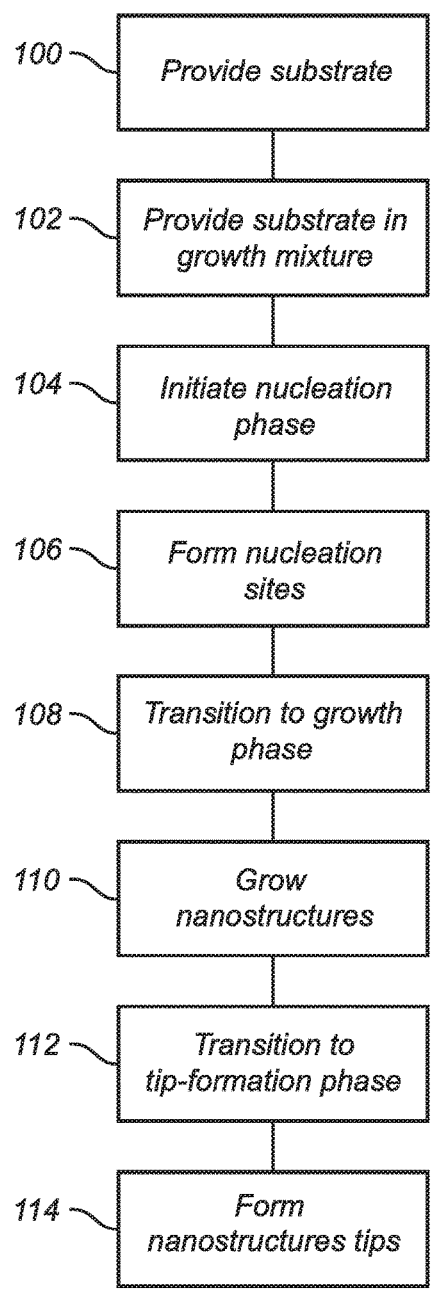
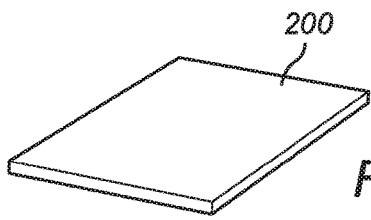
Fig. 2A
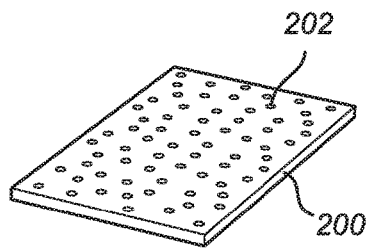
Fig. 2B
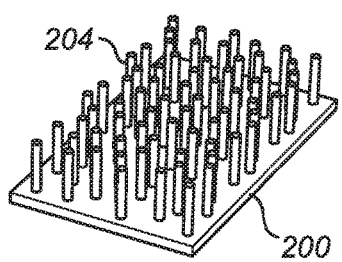
Fig. 2C
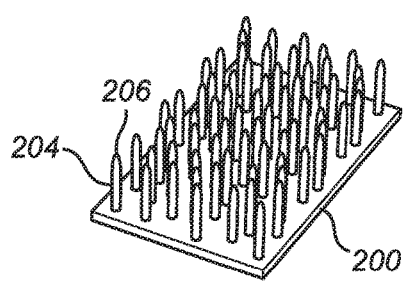
Fig. 2D
Fig. 1

METHOD FOR MANUFACTURING NANOSTRUCTURES FOR A FIELD EMISSION CATHODE

CROSS-REFERENCE TO RELATED APPLICATIONS

This application is a 371 U.S. National Stage of International Application No. PCT/EP2016/060943, filed May 16, 2016, which claims priority to European Application No. 15167996.6, filed on May 18, 2015. The disclosures of each of the above applications are incorporated herein by reference in their entirety.

FIELD OF THE INVENTION

The present invention relates to the field of field emission lighting, and specifically to a method for manufacturing nanostructures for a field emission cathode and to a field emission cathode.

TECHNICAL BACKGROUND

The technology used in modern energy saving lighting devices uses mercury as one of the active components. As mercury harms the environment, extensive research is done to overcome the complicated technical difficulties associated with energy saving, mercury-free lighting.

An approach used for solving this problem is to use field emission light source technology. Field emission is a phenomenon which occurs when a very high electric field is applied to the surface of a conducting material. This field will give electrons enough energy such that the electrons are emitted (into vacuum) from the material.

In prior art devices, a cathode is arranged in an evacuated chamber, having for example glass walls, wherein the chamber on its inside is coated with an electrically conductive anode layer. Furthermore, a light emitting layer is deposited on the anode. When a high enough potential difference is applied between the cathode and the anode thereby creating high enough electrical field strength, electrons are emitted from the cathode and accelerated towards the anode. As the electrons strike the light emitting layer, typically comprising a light powder such as a phosphor material, the light powder will emit photons. This process is referred to as cathodoluminescence.

One example of a light source applying field emission light source technology is disclosed in EP1709665. EP1709665 disclose a bulb shaped light source comprising a centrally arranged field emission cathode, further comprising an anode layer arranged on an inside surface of a glass bulb enclosing the field emission cathode. The disclosed field emission light source allows for omnidirectional emission of light, which for example is useful in relation to a retrofit light source implementation.

Even though the EP1709665 shows a promising approach to a mercury free light source, the cathode structure used is relatively basic, specifically for achieving a high level of uniformity in regards to light emission. There is thus a desire to improve upon the cathode structure, thereby improving the overall impression of light emitted from the field emission light source. In addition, there is also a desire to present improvements in regards to a manufacturing method used for forming such a cathode, in particular concerning uniformity, controllability and repeatability.

Further attention is drawn to US2014346976 A1, relating to a method for manufacturing a plurality of nanostructures comprising the steps of providing a plurality of protruding base structures arranged on a surface of a first substrate, providing a seed layer mixture, comprising a solvent/dispersant and a seed material, in contact with the protruding base structures, providing a second substrate arranged in parallel with the first substrate adjacent to the protruding base structures, thereby enclosing a majority of the seed layer mixture between the first and second substrates, evaporating the solvent, thereby forming a seed layer comprising the seed material on the protruding base structures, removing the second substrate, providing a growth mixture, comprising a growth agent, in contact with the seed layer, and controlling the temperature of the growth mixture so that nanostructures are formed on the seed layer via chemical reaction in presence of the growth agent.

Further attention is also drawn to US2007284573 A1, relating to a process for fabricating ZnO nanowires with high aspect ratio at low temperature, which is associated with semiconductor manufacturing process and a gate controlled field emission triode is obtained. The process comprises providing a semiconductor substrate, depositing a dielectric layer and a conducting layer, respectively, on the semiconductor substrate, defining the positions of emitter arrays on the dielectric layer and conducting layer, depositing an ultra-thin ZnO film as a seeding layer on the substrate, growing the ZnO nanowires as the emitter arrays by using hydrothermal process, and etching the areas excluding the emitter arrays, then obtaining the gate controlled field emission triode.

SUMMARY OF THE INVENTION

In view of the above-mentioned and other drawbacks of the prior art, a general object of the present invention is to provide an improved method for manufacturing a cathode for use in a field emission arrangement, where the resulting cathode plays an essential role in achieving a high level of uniformity in regards to light emission.

According to a first aspect of the present invention, it is provided a method for forming a plurality of ZnO nanostructures comprising the steps of: providing a growth substrate; providing a growth solution comprising a Zn-based growth agent, the growth solution having a predefined initial pH-value at room temperature; arranging the growth substrate in the growth solution; increasing the pH value of the growth solution to reach a nucleation phase forming nucleation sites on the substrate; maintaining the pH value at an elevated level for a predetermined nucleation time to control nucleation site density during the nucleation phase; decreasing the pH value to transition from the nucleation phase to a growth phase; growing the nanostructures for a predetermined growth-time; and increasing the pH value to transition from the growth phase to a tip-formation phase.

Here, the term nanostructure refers to a structure where at least one dimension is on the order of up to a few hundreds of nanometers. In particular, the nanostructure herein mainly refers to a nanorod. Such a nanorod may also be referred to as a nanowire, nanotube, nanopencil, nanospike, nanoneedle and nanofibre.

The growth substrate can be a planar substrate comprising Ni, Cu or Fe, or it can be a silicon-based or other semiconductor substrate coated with one of the aforementioned metals. However, the substrate material is not limited to the abovementioned materials, and any suitable material can be used. Moreover, nanostructures can be formed directly on the substrate, or the substrate may comprise Zn seed particles from which nanostructures are primarily formed. A substrate having a surface comprising seed particles may be referred to as a seeded substrate.

The present invention is based on the realization that a well controlled method for manufacturing high quality nanostructures can be achieved by controlling the pH value of the growth solution through three different phases of nanostructure formation, a nucleation phase, a growth phase and a tip-formation phase. Through the inventive method, an assembly of nanostructures can be grown which exhibit a desirable distribution with respect to height/length, tip sharpness, separation and alignment. It should thus be understood that the properties referred to and discussed herein relates to average properties of the distribution of the grown nanostructures.

The nucleation phase is the initial phase where a plurality of ZnO nuclei is formed on the growth substrate to facilitate further growth of ZnO nanostructures. During the nucleation phase it is possible to control the density of nucleation sites on the growth surface so that the resulting nanostructure density can be controlled.

During the growth phase, the size of the nanostructures is controlled, and in particular the height and width of the nanostructures.

Finally, in the tip formation phase, the geometry of the outermost portion of the nanostructure can be controlled. In some applications, such as in a field emission device, it is typically desirable to have a sharp tip of the field emission cathode in order to improve field emission properties. A suitable nanostructure for a field emission diode may for example be a nanorod. Moreover, the method may advantageously comprise a phase of forming tapered tips of the nanostructures. Moreover, the nanostructure tips may advantageously have a radius of curvature in the range of 1 to 20 nm.

The key difference between the present invention typical prior art, such as for example the above mentioned US2014346976 A1 is that according to the invention, the nucleation is performed using the same solution as during growth of the nanowires, and that the transition between nucleation and growth phases is done by controlling the pH value of the growth solution without removing the base structures from the growth solution in between the different phases. In comparison, in e.g. US2014346976 A1, a seed layer mixture is used which is subsequently evaporated to form a seed layer on the base structures. Nanowire growth is then performed by immersing the seeded base structures in a growth mixture. Accordingly, the present invention provides a simplified growth method where nucleation and growth is performed in the same sequence.

Furthermore, in accordance to the prior art approach of hydrothermal growth method for forming ZnO nanowires, such as in the above mentioned US2007284573 A1, the seed layer is defined by photolithography, spray coating and lift off. After deposition of the seed layer, a hydrothermal method is used to grown the ZnO nanowires.

According to an embodiment of the invention, the step of increasing the pH value to initiate a nucleation phase may advantageously comprise heating the growth solution to a first temperature. Heating the growth solution accelerates the decomposition of HMTA, releasing ammonia, which leads to an increase in the pH-value.

According to one embodiment of the invention, the step of increasing the pH value to transition from the growth phase to the tip-formation phase may comprise decreasing the temperature of the growth solution to a second temperature, lower than the first temperature.

According to one embodiment of the invention, the predefined initial pH-value may advantageously be in the range of 4.5 to 6.7. The initial pH value is for example selected based on the size of the substrate on which the nanostructures are to be grown, where a larger substrate requires a higher Zn-concentration which in turn gives a lower pH value. The initial pH value is also selected based on the desired nucleation site density. Furthermore, the initial pH value will also depend on if the growth substrate comprises seed particles or not, where a lower pH value is selected for a seeded substrate compared to for an un-seeded substrate.

According to one embodiment of the invention, the nanorods may advantageously have a length in the range of 3-50 μm and a diameter in the range of 20-300 nm.

In one embodiment of the invention, the first temperature of the growth solution may advantageously be controlled to be 90° C., and the second temperature of the growth solution may be controlled to be 70° C. It should be understood that small variations of the temperatures are possible without significantly influencing the process. There is also a correlation between the temperature, growth agent concentration and pH value, so that a change in initial pH value of the growth solution and/or a change in composition of the growth solution may require different temperatures to reach the desired result.

According to one embodiment of the invention, the growth substrate may be a wire comprising Ni, Cu or Fe. Furthermore, the growth substrate may be a wire protruding from a planar surface. The growth substrate may also be a wire made from another material having a Ni, Cu or Fe coating. The growth substrate may also be coated by any other suitable material.

There is also provided a field emission arrangement comprising a field emission cathode comprising nanostructures manufactured by the method according to any one of the embodiments discussed above The field emission arrangement comprises an anode structure at least partly covered by a phosphor layer, the anode structure being configured to receive electrons emitted by the field emission cathode structure; an evacuated chamber in which the anode structure and field emission cathode are arranged; and a power supply connected to the anode and the field emission cathode configured to apply a voltage so that an electron is emitted from the cathode to the anode.

The voltage is preferably in the range of 2-20 kV. The voltage may for example be provided by a power supply comprised within the field emission arrangement, e.g. arranged together with (such as for example within a socket in the case the field emission arrangement is a field emission light source) with or in the vicinity of the field emission arrangement. The power supply is preferably connected to the field emission cathode and the anode structure and configured to provide a drive signal for powering the field emission lighting arrangement.

According to a second aspect of the invention, there is provided a field emission cathode structure configured to be used in a field emission lighting arrangement, the cathode structure comprising: at least one electrically conductive base wire configured and arranged to span a volume, a plurality of nanorods grown on the base wire, the nanorods protruding from the base wire in a radial direction of the base wire. The nanorods grown on the base wire may advantageously be grown according the method discussed in relation to the first aspect of the invention.

By forming a cathode structure in the form of at least one base wire spanning a volume, a cathode can be provided having in principle any shape, facilitating the fabrication of anodes and thereby light sources having a corresponding shape. An effect of selecting the shape and position of the field emission cathode based upon a (pre)determined shape of the evacuated envelope of a field emission arrangement is the possibility of providing improvements in relation to the uniformity of light emitted by the field emission lighting arrangement. In particular, emission uniformity can be improved since it is easy to form a field emission cathode where all emitting structures are located at the same distance from the anode, for substantially any shape of the anode. The form factor (i.e. shape) of the evacuated envelope is typically dictated by design considerations, possibly relating to the form factor used for retrofit lighting arrangements, e.g. retrofit light bulbs.

Moreover, the use of nanorods grown on the base wire will improve electron emission properties of the cathode structure as a result of the very sharp tips of the nanorod, i.e. tips having a radius of curvature below approximately 20 nanometers, which result in field enhancement at the location of the nanorod tip. An improved electron emission will also help to lower overall power consumption in a field emission arrangement using a field emission cathode structure according to the present invention.

According to various embodiments of the invention, the cathode structure may have a spiral, spherical or ellipsoidal shape.

According to one embodiment of the invention, at least a first end portion of each base wire is preferably located within the spanned volume. It is preferable that an end portion of the base wire does not protrude outside of the spanned volume, as the protruding portion would disrupt the electric field to the detriment of the overall field emission properties.

In one embodiment of the invention, the at least one base wire is preferably arranged to form at least one wire intersection. There may be one base wire which is arranged to cross itself to form an intersection, or there may be two or more base wires arranged to form one or more intersections to achieve the desired shape of the cathode.

According to one embodiment of the invention, the nanorods may advantageously have a length in the range of 3-50 μm and a diameter in the range of 20-300 nm.

For achieving an improved electron emission, the nanorods preferably comprise nanorods comprising at least one of conductive oxides, borides, nitrides, carbides, metallic alloys and silicides. Most preferably, the nanorods comprise ZnO.

The above discussed cathode is preferably comprised in a field emission lighting arrangement, further comprising an anode structure at least partly covered by a phosphor layer, the anode structure being configured to receive electrons emitted by the field emission cathode, an evacuated chamber in which the anode structure and field emission cathode is arranged, and a power supply connected to the anode and the field emission cathode configured to apply a voltage so that electrons are emitted from the cathode to the anode. In a preferred embodiment white light is emitted. However, differently colored (e.g. red, green, blue) light may also be emitted.

Additional effects and features of the second aspect of the invention are largely analogous to those described above in connection with the first aspect of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail with reference to the appended drawings showing an example embodiment of the invention, wherein:

FIG. 1 outlines the general steps of a method according to an embodiment of the invention;

FIGS. 2A-2D schematically illustrate general steps of a method according to an embodiment of the invention;

DETAILED DESCRIPTION OF PREFERRED EMBODIMENTS OF THE INVENTION

Figure 3:
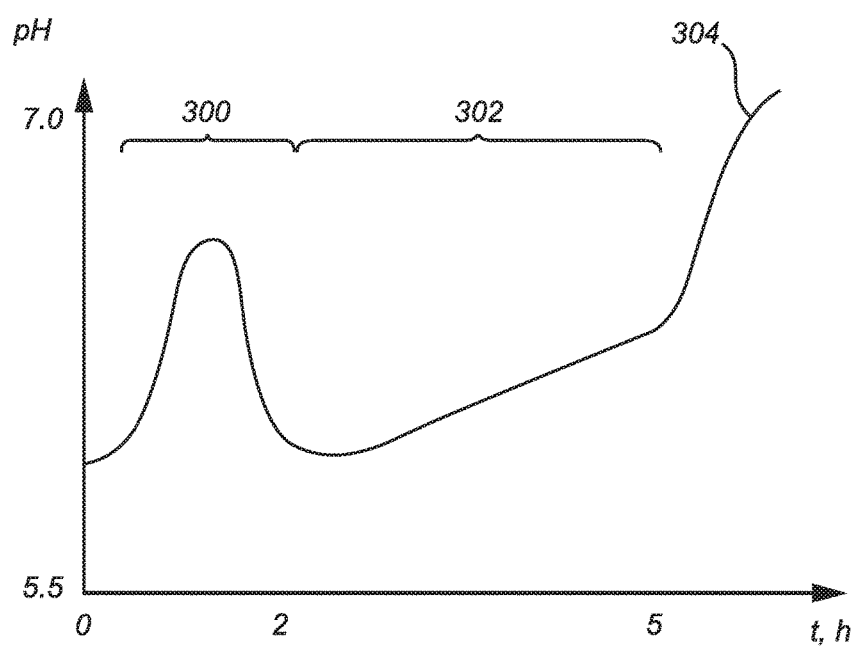
FIG. 3 is a diagram schematically illustrating the pH value as a function of time for a method according to an embodiment of the invention.

In the present detailed description, various embodiments of a method for forming a cathode structure according to the present invention are mainly discussed with reference to a cathode structure comprising ZnO nanostructures suitable for use as field emitters. It should be noted that this by no means limits the scope of the present invention which is equally applicable to cathode structures comprising other types of nanostructures. Like reference characters refer to like elements throughout.

FIG. 1 schematically outlines the method for forming a plurality of ZnO nanostructures according to an embodiment of the invention. Some of the method steps of FIG. 1 will further be schematically illustrated in FIGS. 2A-2D. The method will mainly be discussed with reference to ZnO nanorods used as an illustrative example. Moreover, FIG. 3 is a diagram illustrating the pH value of the growth solution as a function of time throughout the process.

In a first step 100, a growth substrate 200 is provided. The growth substrate 200 may for example be a conventional silicon chip or wafer. The substrate may also be glass, glass/ITO a metal substrate, or a substrate having a metal coating layer. A substrate can be used which comprises a reflecting surface, such as a metal or polished metal. A substrate having a reflective surface can add to the overall light extraction efficiency of a field emission light source. In practice it is inevitable that some of the generated light will be emitted towards the substrate. Through use of a reflecting surface, at least a portion of this light can be reflected in a direction so that it leaves the light source. Moreover, the growth substrate may also be a wire, a mesh, a grid or a 3D structure.

Next 102, the substrate 200 is provided in a growth solution comprising a growth agent.

The method is based on a growth agent in the form of a zinc salt precursor such as ($Zn(Ac)_2$ (zinc acetate), $Zn(NO_3)_2$ (zinc nitrate), or $ZnCl_2$ (zinc chloride)) and also HMTA (hexamethylenetetramine). The overall process is based on a complex interplay between various reactions occurring on the growth substrate and in the growth solution and preferably during a temperature cycle from room temperature, up to 90° C., and at the end at a somewhat lower temperature. Basically all reactions occurring during the growth are strongly pH dependent and the critical steps during the growth of the ZnO can be identified and controlled by monitoring and controlling the pH of the growth solution. The major coupled pH dependent reactions are summarized below:

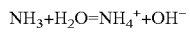

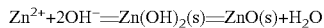

In addition, complexation reactions occur between zinc ions and the formed ammonia. From the given reactions above it can be understood that ZnO precipitation and growth is dependent on both $Zn^{2+}$ concentration and pH-value. However, temperature is another parameter to control in order to be able to grow a nanorod structure with desired rod separation, rod length and tip radius of the rods.

In the next step 104, initiation of nucleation of ZnO on the substrate requires a supersaturation, i.e. a higher pH than during the growth of the rods. For example, an increase in pH by about 0.2 is required to initiate the nucleation phase 106. The pH value increases by the decomposition of HMTA into ammonia, yielding a more basic solution. To initiate the nucleation phase, the temperature is increased from room temperature using a fixed temperature ramping rate. The ramping rate is selected based in the initial pH-value and zinc concentration. During the nucleation phase, nucleation sites 202 are formed on the substrate 200.

The starting pH value, zinc concentration and temperature increase rate determine the nucleus 202 density and hence the resulting rod separation at the end of the process. For low zinc concentrations, about 1 mM, the starting pH should be about 6.2 at room temperature for a subsequent temperature increase from room temperature to 90° C. For a higher zinc concentration, the starting pH should be lower. For e.g. a zinc concentration of 24 mM, the starting pH should be 5.8 with other conditions the same as discussed above.

The above methods steps are described with respect to an un-seeded substrate. However, the same reasoning applies also for a substrate comprising Zn seed particles, i.e. a seeded substrate. A seeded substrate can be formed by dipping the substrate in a solution comprising zinc acetate, zinc nitrate, and/or zinc chloride. After dipping, the substrate is heat treated at about 250° C. for approximately 30 min to evaporate the solvents thereby forming Zn seed particles on the surface of the substrate.

When using a seeded substrate, the starting pH value should be approximately 5.0. Moreover, the use of a seeded substrate will result in an increased density of grown nanostructures. The following description will mainly be focused on the use of an un-seeded substrate. The skilled person readily realizes that the same teachings also apply to a seeded substrate.

After nucleation sites 202 have been formed, a transition 108 to the growth phase 110 takes place. The transition from the nucleation phase to the growth phase, and the corresponding change in pH-value, is a result of the change in composition of the growth solution occurring during the nucleation phase. By selecting the appropriate temperature ramping, the nucleation phase occurs during the temperature ramping so that the temperature of the growth solution is approximately 90° C. when the growth phase starts.

When the growth phase 110 is reached and the ZnO nanorods 204 start to grow, OH is consumed through the formation of $Zn(OH)_2$ which leads to a decrease in pH value in the growth solution, while HMTA decomposition leads to an increase in pH value. As result of the two competing and opposing processes not being entirely balanced with respect to the influence on the pH-value of the growth solution, the overall result will be a small gradual increase in pH value of the growth solution over time during nanorod growth.

During the growth phase, the temperature is kept constant at approximately 90° C. and the pH increases slightly mainly due to additional decomposition of HMTA. The duration of the growth phase determines the length of the ZnO nanorods 204. Here, a growth phase of about 200 min yields ZnO nanorods 204 having an average length of approximately 12 µm. Nanorod density and rod dimensions can be designed by controlling temperature, time, and precursor concentrations for every initially set pH value.

During the growth phase 110 the pH will increase slightly and when the desired length of the nanorods has been reached at the end of the phase, the pH will purposely be increased by decreasing the temperature from 90° C. to 70° C. facilitating a transition 112 into a tip-formation phase to form 114 the sharp tips on the ZnO rods.

In the tip-formation phase 112, tapered tips 206 are formed on the ZnO nanorods 206. In a field emission arrangement it is desirable to provide the best possible electron emission properties from the nanorod. Here the electron emission properties can be improved by providing a sharper nanorod tip which in turn leads to a better concentration of the field strength at the nanorod tip.

The ZnO nanorods may also be doped during growth. This may for example be achieved by adding $Al(NO_3)_2$ or $Ga(NO_3)_3$ either at the tip formation phase or from the start of the nucleation and growth process.

Figure 4:
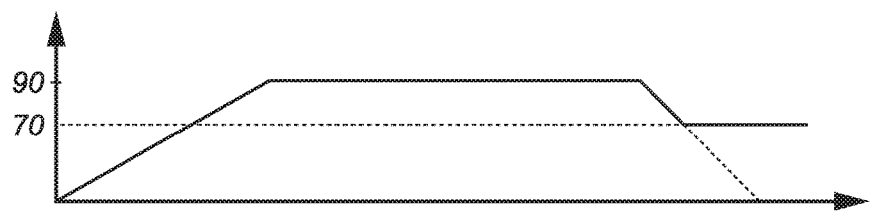
FIG. 4 is a diagram schematically illustrating the temperature as a function of time for a method according to an embodiment of the invention.

FIG. 3 is a diagram illustrating the pH-value as a function of time for a manufacturing method according to an embodiment of the invention, and FIG. 4 illustrates the corresponding temperature vs time for the growth process. The initial pH value is here approximately 6.2, which is increased to approximately 6.5 during the nucleation phase 300 when the temperature increases from room temperature up to approximately 90° C. After the nucleation phase 300, the pH-value is reduced to approximately 6.2 when the growth phase 302 starts. During the growth phase 302 the pH-value increases slightly as discussed above until the growth phase is completed and a transition to the tip-formation phase 304 is initiated by decreasing the temperature to approximately 70° C. Depending on the desired shape of the nanorod tips, the temperature may be decreased to 70° C. and be kept there for a set amount of time until the desired tip shape is reached. Alternatively, the temperature may be ramped down from 90° C. to room temperature, in which case the tip formation takes place during the temperature ramp. Here, the shape of the tip can be tailored by selecting the temperature ramp.

As discussed above, the starting pH value for a seeded substrate is in the range of 5 to 6, whereas the pH values during the growth and tip-formation phase is substantially the same as for an un-seeded substrate.

Employing a low-temperature hydrothermal growth method as described above is advantageous in that the process is easy and may be performed without complicated and expensive process equipment that is frequently required for high-temperature growth method such as thermal decomposition, thermal evaporation, physical vapor deposition (PVD) or chemical vapor deposition (CVD) methods.

Figure 5A:
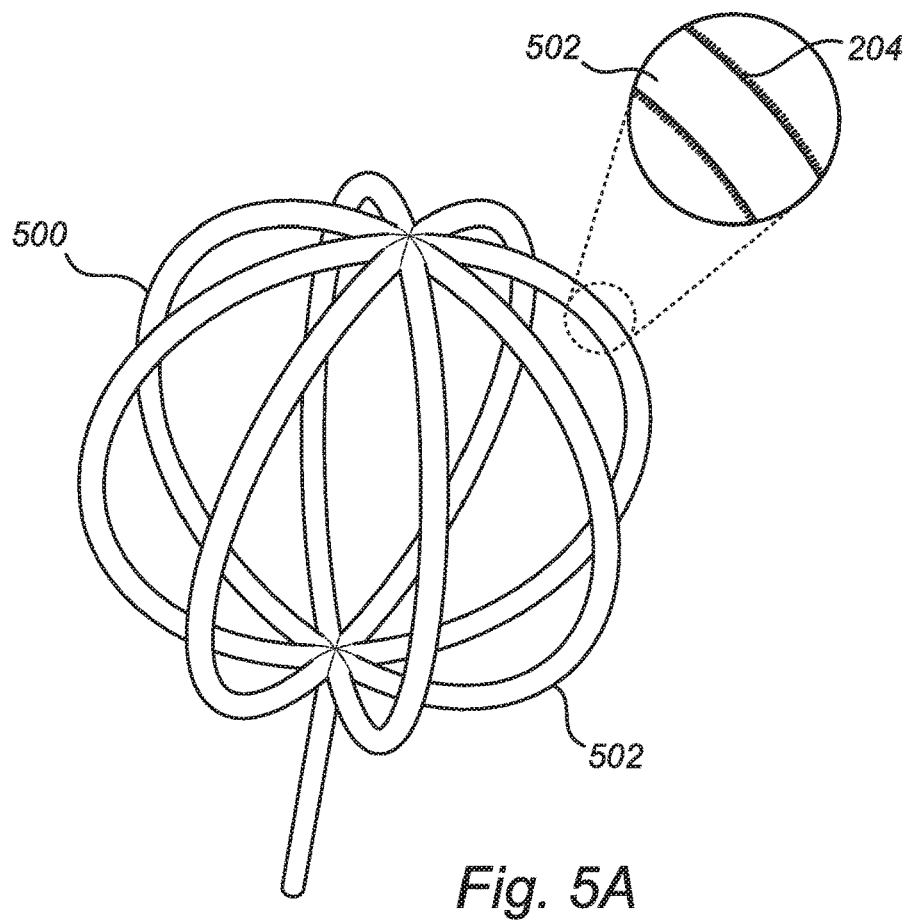
FIGS. 5A-5B are schematic Illustrations of cathode structures according to embodiments of the invention.
Figure 5B:
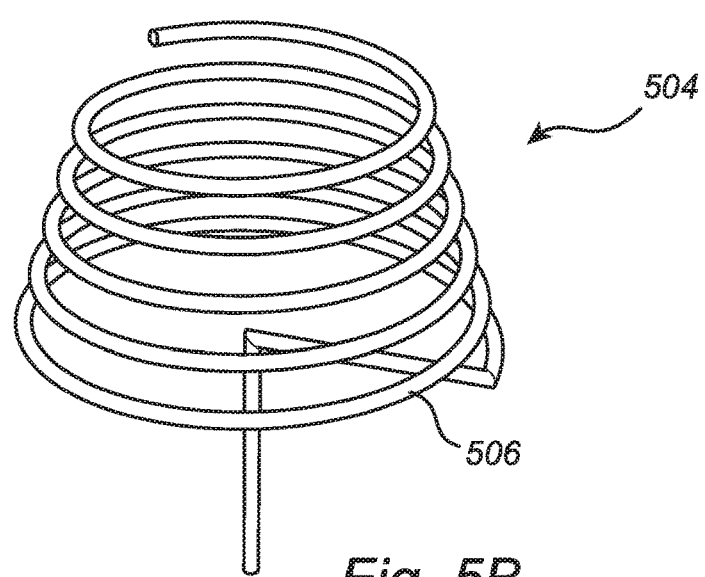

FIGS. 5A-5B are schematic illustrations of cathode geometries according to embodiments of the invention. In FIG. 5A, the cathode 500 comprises base wires 502 spanning a substantially spherical volume (e.g. a "wire cage"). FIG. 5A also illustrates that nanorods 204, such as ZnO nanorods, are grown on the base wire 502, extending substantially perpendicularly from the base wire, to act as electron emitters. The ZnO nanorods are advantageously grown according to the above discussed method to have a length in the range of 3-50 µm and a diameter in the range of 20-1000 nm. The base wire can have a circular cross section having a diameter in the range of 100-10000 µm.

As a comparison to prior art arrangements comprising nanorods being grown on an essentially flat surface, the nanorods 204 according to the invention are instead provided on spatially distributed base wires 502. This has the advantage that it may be possible to provide an improved electron emission. Using the essentially protruding base wires 502 (if compared to a flat surface) is advantageous regarding the voltage that needs to be applied over the cathode in order to achieve field emission from the nanorods 204 arranged on the base wires 502. For a flat surface, a higher voltage is required to achieve field emission in contrast to the presented structure where the voltage is concentrated to the base wires 502 thereby resulting in a higher electric field at the position of the nanorods 204 acting as field emitters.

FIG. 5B illustrates a cathode structure 504 spanning a volume corresponding to a truncated cone made up of a single spiral shaped base wire 506. Also in FIG. 5B, the ZnO nanorods are protruding from the base wire.

The cathodes shown in FIGS. 5A-5B are examples illustrating the concept of arbitrarily shaped cathode structures based on wires spanning a volume, enabling the formation of cathodes which may be used with anode structures and envelopes having in principle any practical shape. As can be seen in FIGS. 5A-5B, the cathode is arranged so that the only part of the base wire which protrudes form the spanned volume is the part of the base wire which is to be connected to a power supply.

Figure 6:
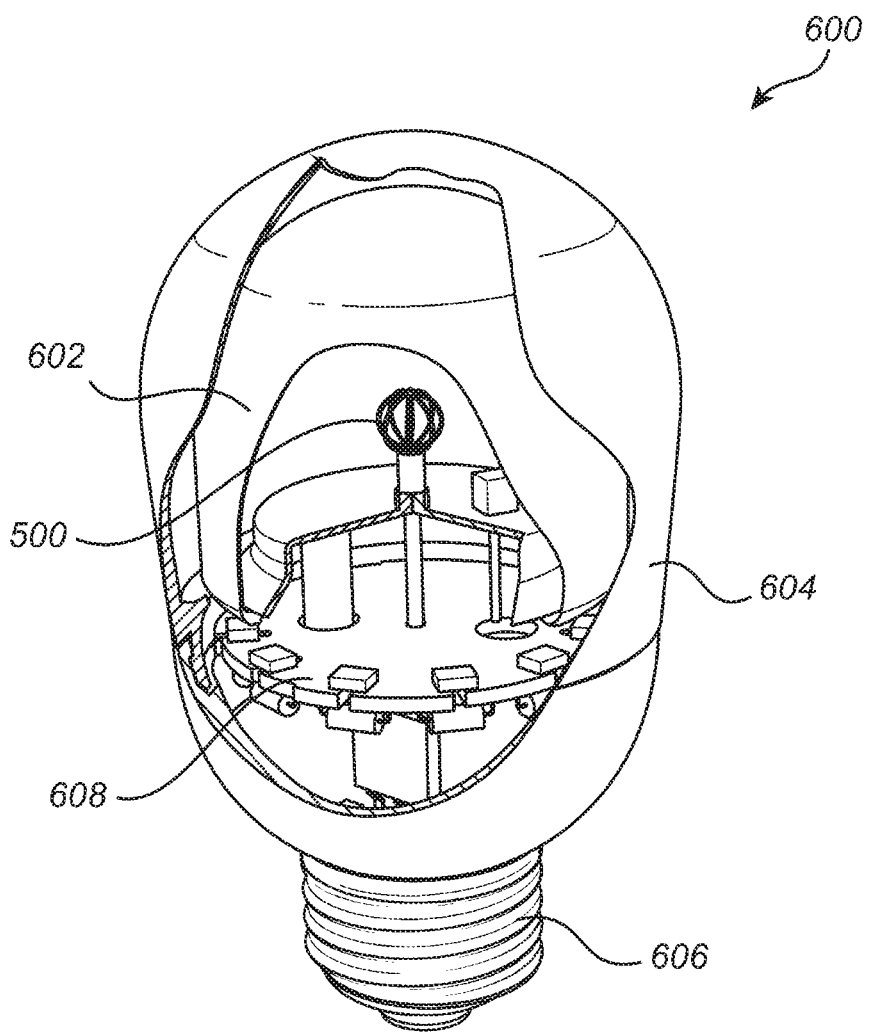
FIG. 6 is a schematic diagram of a lighting arrangement according to an embodiment of the invention.

FIG. 6 schematically illustrates a field emission lighting arrangement 600. The lighting arrangement 600 comprises a glass structure 602 covered on its inside with a transparent electrode layer forming an anode electrode. The anode electrode is at least partially covered by a phosphor layer. Furthermore, the lighting device 600 comprises a cover 604, for example in the form of a diffusing plastic material enclosing the glass structure 604.

The anode structure is configured to receive electrons emitted by the centrally arranged field emission cathode structure 500. The cathode 500 is here provided in the form of a wire structure comprising a plurality of ZnO nanorods acting as light emitters as illustrated in FIG. 5A.

In an embodiment of the field emission lighting arrangement 600, it may be advantageous to adapt the shape/form of the "wire cage" of the field emission cathode structure 500 with respect to the glass structure 602, in case of a "classically" shaped lamp glass structure. Specifically, it is desirable to achieve a uniform emission of electrons emitted from the cathode 500 impinging on the anode/phosphor layer. As the "density" of base wires 502 at the "top" of the field emission cathode structure 500 is increased, closely arranged base wires 502, compared to on the "sides" of the field emission cathode structure 500, the electric field at the top of the field emission cathode structure 500 will be somewhat lower as compared to the sides of the field emission cathode structure 500. Thus, it is suggested to shape the field emission cathode structure 500 to be somewhat elongated/elliptical, thereby decreasing the distance between the glass structure 602/anode and the field emission cathode structure 500 at the top of the field emission cathode structure 500. Accordingly, it may be possible to achieve a more uniform emission of light as compared to the case when the shape of the field emission cathode structure 500 is selected such to have an essentially uniform radius. Further related features and advantages of the embodiment illustrated in FIG. 6 are discussed in European patent application EP13160768.1, hereby incorporated by reference in its entirety. EP13160768.1 specifically handles the spatial relation between the anode and the cathode of a field emission light source.

The phosphor layer may provide luminescence when the emitted electrons collide with phosphor particles of the phosphor layer, thereby exciting electrons which when recombining emits photons. Light provided from the phosphor layer will transmit through the transparent anode layer 602 and the cover 604. The light is preferably white, but colored light is of course possible and within the scope of the invention. The light may also be UV light.

A lamp base 606 is provided for installing the lighting device 600 in e.g. an Edison based socket. Other types of light bases are of course possible and within the scope of the invention. The lamp base 606 allows the lighting device 600 to be connected to the mains, e.g. an alternating voltage between 90-270 V @ 40-70 Hz. The lamp base 308 is in turn connected to a power supply 60 connected to the anode structure and the field emission cathode structure and configured to apply a voltage so that an electron is emitted from the nanostructures of the cathode towards the anode.

Figure 7:
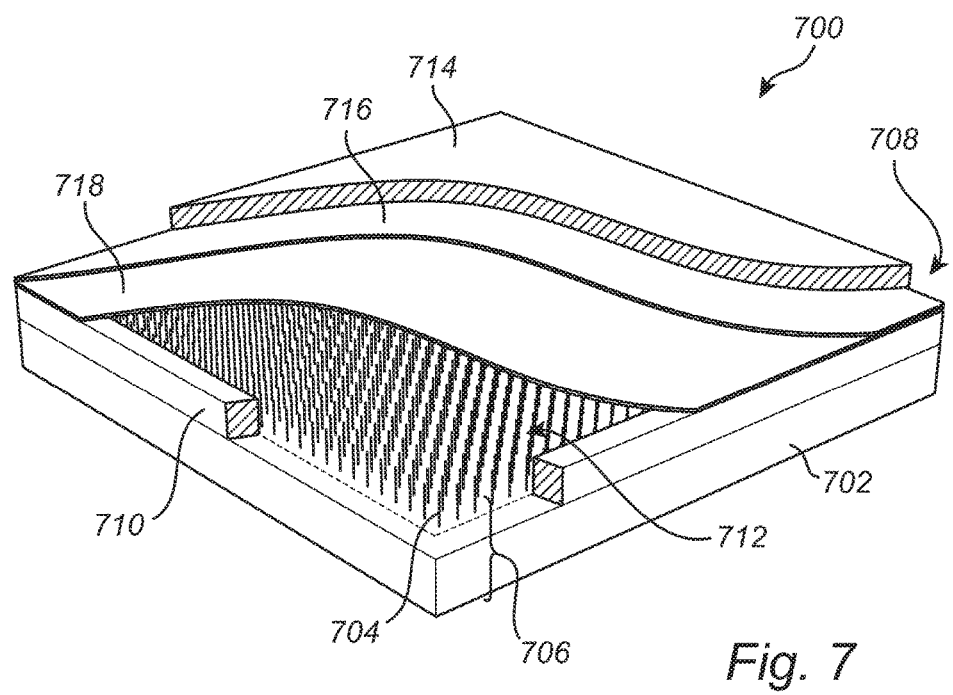
FIG. 7 is a schematic diagram of a lighting arrangement according to an embodiment of the invention.

Referring now to FIG. 7, there is illustrated a field emission light source 700 according to an example embodiment of the invention. The field emission light source 700 comprises a wafer 702 provided with a plurality of ZnO nanorods 704 having a length of at least 1 um, the wafer and plurality of ZnO nanorods 704 together forming a field emission cathode 706. In a possible embodiment the ZnO nanorods may be selectively arranged onto spaced protrusions (not shown). The ZnO nanorods may advantageously be grown using the above discussed method. It may also, as an alternative, be possible to substitute the ZnO nanorods 704 for carbon nanotubes (CNT, not shown). The field emission light source 700 further comprises an anode structure 708 arranged in close vicinity of the field emission cathode 706.

The distance between the field emission cathode 706 and the anode structure 708 in the current embodiment is achieved by arranging a spacer structure 710 between the field emission cathode 706 and the anode structure 708, where a distance between the field emission cathode 706 and the anode structure 708 preferably is between 100 um to 5000 um. The cavity 712 formed between the field emission cathode 706 and the anode structure 708 is evacuated, thereby forming a vacuum between the field emission cathode 706 and the anode structure 708.

The anode structure 708 comprises a transparent substrate, such as a planar glass structure 714. Other transparent materials are equally possible and within the scope of the invention. Examples of such materials are quartz and sapphire. The transparent structure 714 is in turn provided with an electrically conductive and at least partly transparent anode layer, typically a transparent conductive oxide (TCO) layer, such as an indium tin oxide (ITO) layer 716. The thickness of the TCO layer is selected to allow maximum transparency with a low enough electrical resistance. In a preferred embodiment the transparency is selected to be above 90%. The ITO layer 716 may be applied to the glass structure 714 using any conventional method known to the skilled person, such as sputtering or deposition by solvent, or screen-printing. As will be discussed below, the electrically conductive anode layer 716 may take different shapes and forms depending on the implementation at hand.

It should be noted that the glass structure 714 not necessarily has to be planar. In a possible embodiment, the glass structure 714 may be selected to form a lens for the field emission light source (e.g. being outward bulging), thereby possibly further enhancing the light extraction and mixing of light emitted from the field emission light source. It may also be possible to provide the glass structure with an anti-reflective coating.

During operation of the field emission light source 700, a power supply (not shown) is controlled to apply a voltage between the field emission cathode 706 and the ITO layer 716. The voltage is preferably between 0.1-10 kV, depending for example on the distance between the field emission cathode 706 and the anode structure 708, the sharpness, height and length relationship of the plurality of ZnO nanorods 704 and the desired performance optimization.

Electrons will be released from the outer tip end of the ZnO nanorods 704 and accelerated by the electric field towards the anode structure 708 in a direction towards phosphor layer 718 such that light will be emitted. The light emitted from the phosphor layer 718 will pass through the ITO layer 716 and through the glass structure 714 and thus out from the field emission light source 700.

Further features and advantages of the embodiment illustrated in FIG. 7 are discussed in European patent application EP14198645.5, hereby incorporated by reference in its entirety. For example, it may in one embodiment be possible to place a reflective (e.g. metal, such as aluminum) layer on top of the phosphor layer 718 in in a direction towards the cathode 706. The reflective layer must be thin enough and the electron energy must be high enough so that the electrons to a major extent will penetrate the reflective layer and deposit the majority of their energy into the phosphor layer. An advantage with this configuration is that the reflective layer may protect the underlying light converting material (such as the phosphor layer 718) from decomposition. In addition, the reflective features discussed may provide for minimizing light emission losses.

In summary, the present invention relates to a method for forming a field emission cathode. The method comprises arranging a growth substrate in a growth solution comprising a Zn-based growth agent, the growth solution having a pre-defined pH-value at room temperature; increasing the pH value of the growth solution to reach a nucleation phase; upon increasing the pH of the solution nucleation starts. The growth phase is then entered by decreasing the pH. The length of the nanorods is determined by the growth time. The process is terminated by increasing the pH to form sharp tips. Through the inventive method, an assembly of nanostructures can be grown which exhibit a desirable distribution with respect to height/length, tip sharpness, separation and alignment. It should thus be understood that the properties referred to and discussed herein relates to average properties of the distribution of the grown nanostructures.

Even though the invention has been described with reference to specific exemplifying embodiments thereof, many different alterations, modifications and the like will become apparent for those skilled in the art. Variations to the disclosed embodiments can be understood and effected by the skilled addressee in practicing the claimed invention, from a study of the drawings, the disclosure, and the appended claims. Furthermore, in the claims, the word "comprising" does not exclude other elements or steps, and the indefinite article "a" or "an" does not exclude a plurality.

The invention claimed is:

1. A method for forming a plurality of ZnO nanostructures for a field emission cathode, the method comprising the steps of:
   providing a growth substrate;
   providing a growth solution comprising a Zn-based growth agent, said growth solution having a pre-defined initial pH-value at room temperature;
   arranging said growth substrate in said growth solution;
   increasing said pH value of said growth solution to reach a nucleation phase forming nucleation sites on said substrate;
   decreasing said pH value to transition from said nucleation phase to a growth phase;
   growing said nanostructures for a predetermined growth-time; and
   increasing said pH value to transition from said growth phase to a tip-formation phase.

2. The method according to claim 1, wherein said step of increasing said pH value to initiate a nucleation phase comprises heating said growth solution to a first temperature.

3. The method according to claim 2, wherein said step of increasing said pH value to transition from said growth phase to said tip-formation phase comprises decreasing said temperature of said growth solution to a second temperature, lower than said first temperature.

4. The method according to claim 1, wherein said pre-defined initial pH-value is in the range of 4.5 to 6.7.

5. The method according to claim 1, wherein said nanostructure is a nanorod.

6. The method according to claim 1, wherein said tip-formation phase comprises forming tapered tips on said nanostructures, said tapered tips having a radius of curvature in the range of 1 to 20 nm.

7. The method according to claim 3, wherein said first temperature of said growth solution is controlled to be 90° C. and said second temperature of said growth solution is controlled to be 70° C.

8. The method according to claim 1, wherein said growth substrate is a planar substrate.

9. The method according to claim 1, wherein said growth substrate is a Ni, Fe or Cu wire.

10. The method according to claim 1, wherein said growth substrate comprises a wire protruding from a planar surface.

11. A field emission arrangement comprising:
    a field emission cathode comprising ZnO nanostructures formed by a method according to claim 1;
    an anode structure at least partly covered by a phosphor layer, said anode structure being configured to receive electrons emitted by said field emission cathode structure;
    an evacuated chamber in which said anode structure and field emission cathode is arranged; and
    a power supply connected to the anode and the field emission cathode configured to apply a voltage so that an electron is emitted from the cathode to the anode.

12. A field emission cathode structure configured to be used in a field emission lighting arrangement, said cathode structure comprising:

at least one electrically conductive base wire configured and arranged to span a volume, and a plurality of nanorods formed on said base wire in accordance to claim 1, said nanorods protruding from said base wire.

13. The field emission cathode structure according to claim 12, wherein said nanorods protruding from said base wire in a radial direction of said base wire.

14. The cathode structure according to claim 12, wherein said at least one base wire is arranged in to span a volume having the shape of a cone, a truncated cone, a sphere or an ellipsoid.

15. The cathode structure according to claim 12, wherein said at least one base wire is arranged to form at least one wire intersection.

16. The cathode structure according to claim 12, wherein said nanorods have a length in the range of 3-50 µm and a diameter in the range of 20-300 nm.

17. A field emission lighting arrangement comprising:
- an anode structure at least partly covered by a phosphor layer, said anode structure being configured to receive electrons emitted by a field emission cathode structure according to claim 12;
- an evacuated chamber in which said anode structure and said field emission cathode is arranged; and
- a power supply connected to the anode structure and the field emission cathode structure cathode configured to apply a voltage so that an electron is emitted from the nanorods of the cathode to the anode.

* * * * *